United States Patent [19]
Joerg et al.

[11] Patent Number: 5,053,317
[45] Date of Patent: Oct. 1, 1991

[54] RADIATION-POLYMERIZABLE MIXTURE AND COPYING MATERIAL PRODUCED COMPRISING POLYURETHANE-POLYUREA POLYMER

[75] Inventors: Klaus Joerg, Ingelheim; Rudolf Zertani, Mainz-Bretzenheim, both of Fed. Rep. of Germany

[73] Assignee: Hoechst Aktiengesellschaft, Frankfurt am Main, Fed. Rep. of Germany

[21] Appl. No.: 443,462

[22] Filed: Nov. 30, 1989

[30] Foreign Application Priority Data

Dec. 6, 1988 [DE] Fed. Rep. of Germany ....... 3841025

[51] Int. Cl.$^5$ .............................................. B03F 7/035
[52] U.S. Cl. ..................................... 430/281; 430/288; 430/906
[58] Field of Search ............... 430/906, 281, 288, 285; 522/97

[56] References Cited

U.S. PATENT DOCUMENTS

| | | | |
|---|---|---|---|
| 3,804,631 | 4/1974 | Faust | 96/115 |
| 3,951,657 | 4/1976 | Recchia et al. | 430/906 |
| 4,183,836 | 1/1980 | Wolfe, Jr. | 260/29.2 TN |
| 4,186,017 | 1/1980 | Palmer | 430/162 |
| 4,203,883 | 5/1980 | Hangauer, Jr. | 260/29.2 TN |
| 4,248,958 | 2/1981 | Faust | 430/906 |
| 4,358,354 | 11/1982 | Iida et al. | 204/159.15 |
| 4,590,144 | 5/1986 | Schornick et al. | 430/273 |
| 4,877,711 | 10/1989 | Aoai et al. | 430/270 |
| 4,898,803 | 2/1990 | Aoai et al. | 430/270 |

FOREIGN PATENT DOCUMENTS

| | | |
|---|---|---|
| 1361298 | 7/1974 | United Kingdom . |
| 1464942 | 2/1977 | United Kingdom . |
| 2091278 | 7/1982 | United Kingdom . |
| 2185120 | 7/1987 | United Kingdom . |

OTHER PUBLICATIONS

Patent Abstract Radiation Chem., Photochem. vol. 92, 1980 p. 665 92:32017b Japanese 79/14,491.
Patent Abstract Radiation Chem., Photochem. vol. 105, 1986 p. 617 105:52221d Japanese 61 20,939.

Primary Examiner—Charles L. Bowers, Jr.
Assistant Examiner—John S. Y. Chu
Attorney, Agent, or Firm—Foley & Lardner

[57] ABSTRACT

A radiation-polymerizable mixture is described which comprises
 a) a saturated polyurethane containing carboxyl groups and repeating urea groups as binder,
 b) a radical-polymerizable compound containing at least one terminal olefinic double bond and having a boiling point above 100° C. at normal pressure, and
 c) a compound or combination of compounds capable of initiating the polymerization of compound (b) on exposure to actinic radiation.

The mixture can be developed with purely aqueous developers and yields lithographic printing plates with high photosensitivity, low stickiness and high print runs.

19 Claims, No Drawings

RADIATION-POLYMERIZABLE MIXTURE AND COPYING MATERIAL PRODUCED COMPRISING POLYURETHANE-POLYUREA POLYMER

BACKGROUND OF THE INVENTION

The invention relates to a mixture which can be polymerized by radiation, in particular ultraviolet or visible light, and which contains a water-insoluble binder which is soluble in aqueous alkaline solutions, a free-radical-polymerizable compound and a radiation-activable polymerization initiator for the polymerizable compound, and also to a copying material having a copying layer composed of the said mixture.

Radiation-polymerizable and photopolymerizable mixtures of the class specified are known. They contain, for example, copolymers of acrylic acid or methacrylic acid, of maleic acid, crotonic acid or itaconic acid with neutral comonomers, for example esters of (meth)acrylic acid, styrene, vinyl acetate or (meth)acrylonitrile, as alkali-soluble binders. Such mixtures are described, inter alia, in DE-A-2,064,080 and 2,205,146. In general they are used for the production of letterpress and lithographic printing plates and of photoresists, in particular those which are processed by the dry resist process.

For the production of lithographic printing plates it is important that the radiation-cured or light-cured coating have a high abrasion resistance in order to yield high print runs. This property is primarily determined by the polymeric binder. For lithographic printing plates based on negative working diazonium compounds it is known, for example, from DE-A-2,739,774 that printing forms with high run performance are obtained with polyurethanes as binders. Photopolymerizable mixtures containing such polymers as binders are also described. The disadvantage of such coatings is the poor solubility in aqueous solutions, a high proportion of solvent therefore being necessary in the developer for complete development, as described in EP-A-0,072,918 or DE-A-2,404,239. The incorporation of quaternary and quaternizable nitrogen atoms in a high-molecular weight thermoplastic polyurethane containing lateral unsaturated, photopolymerizable double bonds makes it possible to obtain, as described in EP-A-0,054,150, photopolymerizable copying materials which can be developed with weakly acidic aqueous solutions. The disadvantage of the printing layers which contain such binders is the poor resistance to the acidic fountain solutions used in conventional offset printing since polyurethanes containing basic nitrogen atoms are soluble, or at least extremely swellable, in an acidic medium. Much more advantageous are photopolymerizable layers, which can be developed in an alkaline developer without solvent added.

The Japanese Application JP-A-54/14491 (C.A 92, 32017b) describes the reaction of polyesters containing carboxyl groups with monofunctional, unsaturated isocyanates. The number of urethane groups per molecule which impart good properties such as abrasion resistance to the system is in this case very limited.

DE-A-3,107,585 reveals the use, for the production of printing plates, of unsaturated polyurethanes which contain carboxyl groups and which are produced by reacting an NCO-terminated prepolymer with an olefinically unsaturated diol and then reacting the OH groups still left with a cyclic carboxylic acid anhydride. GB-A-2,091,278 describes the use of polyurethanes containing a carboxylic acid group at one end and an olefinically unsaturated group at the other for the production of photoresists. The disadvantages of the polymers specified in these publications is the low content of carboxylic acid groups per molecule, which manifests itself at higher molecular weights in a poor alkali solubility of the layers.

DE-A-3,639,757 reveals polyurethanes containing carboxyl groups which are used in photosensitive mixtures in combination with diazonium salts. DE-A-3,716,607 describes polyurethanes which are derived from these polymers and which contain, in addition to the carboxyl groups, unsaturated groupings which are photo-crosslinkable. These polymers can be used in printing plates alone or in combination with monomers or diazonium salts. To develop the printing layers, a developer is used which contains 3% benzyl alcohol.

JP-A-61/20939 (C.A. 105, 52221d) describes polyurethanes containing carboxyl groups which are produced by reacting a prepolymer prepared from a polypropylene glycol and an excess of tolylene diisocyanate, with the monoamide produced from diethanolamine and succinic anhydride. After the preparation, the carboxylic acid groups are neutralized with dimethylamine and during this process terminal NCO groups still present are deactivated. The resins are used in printing plates in combination with a methacrylic acid/methacrylate copolymer, a monomeric polymerizable acrylate, a photoinitiator and a dyestuff as photosensitive layer.

The important disadvantage of this binder is the long reaction time associated with its synthesis. Since carboxylic acid groups which render the solution acidic are present during the preparation of the polyurethanes, the reaction rate of the NCO groups with OH groups is considerably reduced (cf. G. W. Becker and D. Braun, Kunststoffhandbuch (Plastics Manual), volume 7, Carl Hanser Verlag, Munich 1983). As the reaction proceeds, the reaction rate decreases further. However, as extensive a reaction as possible is necessary to achieve a high molecular weight. At the same time, this can only be achieved by extremely long reaction times. Reducing the reaction time (prematurely interrupting the reaction by means of dimethylamine) results in short-chain polyurethanes which yield printing plates with poor mechanical properties; in addition, the layers are often sticky in the unexposed state.

U.S. Pat. Nos. 4,183,836 and 4,203,883 reveal the preparation of stable aqueous anionic polyurethane dispersions for coating textile materials via a prepolymer. For this purpose, a NCO-terminated prepolymer containing carboxyl groups is first synthesized; the acid groups are then neutralized in an aqueous solution of a tertiary amine and the NCO groups are reacted with a diamine as chain extender. The process is limited to certain, generally aliphatic diisocyanates which only react slowly with water. No mention is made of any suitability as a binder for photosensitive mixtures.

SUMMARY OF THE INVENTION

Accordingly, it is an object of the present invention to provide an improved radiation-polymerizable, in particular photopolymerizable, mixture which is suitable for the production of photoresists and printing plates, especially lithographic printing plates.

Another object of the present invention is to provide a radiation-polymerizable mixture which forms layers having low stickiness in the unexposed and exposed states.

A further object of the present invention is to provide a radiation-polymerizable mixture which can be easily processed with nonpollutant aqueous solutions and which yields image stencils having a high resistance to solvents and reagents and high abrasion resistance.

In accomplishing the foregoing objectives, there has been provided, in accordance with one aspect of the present invention, a radiation-polymerizable mixture which comprises
a) a saturated polyurethane comprising carboxyl groups as binder,
b) a free-radical-polymerizable compound containing at least one terminal olefinic double bond and having a boiling point above 100° C. at normal pressure, and
c) a compound or combination of compounds capable of initiating the polymerization of compound (b) on exposure to actinic radiation,
wherein the polyurethane additionally contains repeating urea groups in the main chain.

In accordance with another aspect of the present invention there is provided a radiation-polymerizable copying material which comprises a layer support and a radiation-polymerizable layer wherein the layer comprises the above-defined mixture.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF PREFERRED EMBODIMENTS

The polyurethanes used in the mixture according to the invention are saturated compounds, i.e. they do not contain any aliphatic C—C double bonds, in particular any polymerizable or crosslinkable groups. They are prepared by reacting a diol containing carboxyl groups with a diisocyanate to form a prepolymer with terminal NCO groups and reacting the prepolymer with diamines to form a high-molecular-weight polyurethane containing carboxyl groups and urea groups.

Although the polymers are preferably prepared exclusively from bifunctional reactants, it is also possible to add smaller amounts of polyfunctional compounds. Thus, to prepare the prepolymer, up to about 10, preferably not more than 5 mol % of triols or triisocyanates, based in each case on the total molar amount of polyhydric alcohol or polyvalent isocyanate, are added in order to introduce branching points into the polymer molecule in a limited amount. The same can be achieved by adding suitable amounts of triamines to the diamine. The reaction products are preferably linear and the amount of trifunctional compounds must not under any circumstances be so high that crosslinked structures which render the polymer insoluble or sparingly soluble to an undesirable extent and consequently result in gelatinous products are formed in a substantial amount.

The diisocyanates used in the reaction may be of an aliphatic or aromatic nature. In this connection it should be borne in mind that in general aliphatic diisocyanates react more slowly than aromatic ones, i.e., high-molecular-weight products can be obtained with the latter in shorter reaction times. On the other hand, longer-chain aliphatic diisocyanates (for example $C_6$ to $C_{14}$) in general yield products which are less brittle than those prepared from purely aromatic diisocyanates. The radical carrying the two NCO groups contains in general 2 to 20, preferably 6 to 15 carbon atoms and may optionally carry ether groups, ester groups, urethane groups, amido groups, ureido groups or halogen atoms as substituents.

Examples of suitable diisocyanates are: 2,4-tolylene diisocyanate, 2,6-tolylene diisocyanate, p-xylylene diisocyanate, 4,4'-diphenylmethane diisocyanate, 1,5-naphthalene diisocyanate, 4,4'-biphenyl diisocyanate, 2,2-bis(4-isocyanatophenyl) propane, ethylene diisocyanate, n-butylene diisocyanate, hexamethylene diisocyanate, 2,4,4-trimethylhexamethylene diisocyanate, lysine diisocyanate, isophorone diisocyanate, cyclohexane diisocyanate and bis(4-isocyanatocyclohexyl) methane.

Aromatic and aliphatic, and also mixed aliphatic-aromatic compounds, which are monomeric or oligomeric can also be used as diols. Preferred are diols of the general formula I

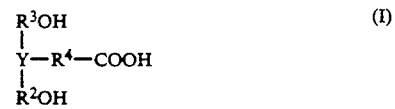

in which Y denotes a nitrogen atom or one of the groups Ar and C-$R^1$; $R^1$ denotes a hydrogen atom, a substituted or unsubstituted alkyl, aralkyl, aryl, alkoxy or aryloxy group, preferably a hydrogen atom, an alkyl group containing 1 to 8 carbon atoms or an aryl group containing 6 to 15 carbon atoms; $R^2$, $R^3$ and $R^4$, which may be identical to, or different from, one another, denote single bonds, substituted or unsubstituted alkylene, alkylenecarbonyl, arylene or mixed aliphatic-aromatic divalent hydrocarbon groups, preferably single bonds, alkylene or alkylenecarbonyl groups containing 1 to 8 carbon atoms; and Ar denotes a substituted or unsubstituted trivalent aromatic group, preferably containing 6 to 12 carbon atoms. If Y=N, $R^2$, $R^3$ and $R^4$ cannot be single bonds.

Possible substituents are, in particular, halogen atoms, or cyano, nitro, carboxyl, acyl, amido, ester, ether, ureido or urethane groups. The hydrocarbon radicals may also be interrupted by ethereal oxygen atoms, or carbonyl, ester, acid amide, urethane or urea groups. Optionally, two of the groups $R^1$, $R^2$, $R^3$ and $R^4$ may be linked to one another in each case to form a ring.

Examples of suitable diols containing carboxyl groups are 3,5-dihydroxybenzoic acid, 2,2-bis(hydroxymethyl)propionic acid, 2,2-bis(hydroxyethyl)propionic acid, 2,2-bis(3-hydroxypropyl)-propionic acid, bis(hydroxymethyl)acetic acid, bis(4-hydroxyphenyl)acetic acid, 2,2-bis(4-hydroxyphenyl)pentanoic acid, tartaric acid and the like.

In addition to the above-described diols containing carboxyl groups, neutral diols which do not contain any carboxyl groups may also be added in order to bring about the required acid number of the polymer. These neutral diols may be of low molecular weight or of higher molecular weight and may be polyether diols or polyester diols. Use is advantageously made of polyether diols, in particular those having molecular weights of 200 to 3000. By incorporating this component, the molecular weight of the final product is increased in the desired manner; the acid number can be controlled and the polyether sequences increase the solubility in purely aqueous developer solutions, with the result that only relatively low acid numbers are required to achieve the alkali solubility. In the case of short oxyalkylene units, for example in the case of polyethylene oxides, the choice of the molecular weight of the polyether diols must not, however, be too high or else the ink acceptance of the light-cured layer is impaired in the case of lithographic printing.

Examples of suitable diols are ethylene glycol, diethylene glycol, triethylene glycol, polyethylene glycols having molecular weights of 200 to 500, propylene glycol, tripropylene glycol, polypropylene glycols having molecular weights of 200 to 2000, ethylene oxide/-propylene oxide copolymers, neopentyl glycol, 1,4-butanediol, polybutanediols having molecular weights of 200 to 2000, 1,6-hexanediol, 2,2,4-trimethyl-1,3-pentanediol, cyclohexanedimethanol and reaction products of ethylene oxide or propylene oxide with bisphenol A.

Suitable polyester diols are those formed from dicarboxylic acids and diols having molecular weights in the same range as the polyether diols. The above-mentioned compounds may be used as diols; suitable dicarboxylic acids are, for example, oxalic acid, glutaric acid, adipic acid, phthalic acid and terephthalic acid.

The urea groups are introduced into the polyurethanes by further reacting the prepolymers containing terminal NCO groups with diamines. Aliphatic or aromatic compounds containing primary or secondary amino groups are used as diamines. The group linking the two amino groups may be an alkylene, arylene, cycloalkylene or a mixed aliphatic-aromatic group. The linking group may also be a polyether group or polyester group of the type described above. Further substituents carried by the nitrogen atoms may in each case be an alkyl group, preferably containing 1 to 8 carbon atoms.

To prepare the polyurethanes used in the mixtures according to the invention, the diisocyanate is reacted in a first stage with the diol containing carboxyl groups and preferably a further diol lacking carboxyl groups. The reaction is normally carried out in an aprotic solvent in the presence of a standard basic catalyst with an excess of NCO groups over OH groups. The preferred ratio of NCO to OH is in the range from (1.01 to 5):1. The choice of the quantitative ratio and the reaction conditions is such that a prepolymer with a relatively low molecular weight is formed, with the result that this reaction is complete within a few hours. In a second stage, the prepolymer obtained is then reacted with the above-mentioned diamine to form a high-molecular-weight polymer containing urethane and urea groups in the main chain and lateral carboxyl groups. This reaction proceeds spontaneously, without an additional catalyst, i.e., even in the case of highermolecular-weight starting substances, it results in a completely reacted high-molecular-weight final product within sufficiently short reaction times, i.e., in general of a few hours. The NCO:NH equivalent ratio used in the second stage is in general in the range from (5 to 1):1.

The equivalent ratio of urea groups to urethane groups in the finished polymer is in general in the range from about 1:99 to 95:5, preferably from 5:95 to 80:20, and in particular from 5:95 to 30:70.

The two-stage process described makes it possible to obtain high-molecular polyurethanes containing carboxyl groups. The formation of urethanes from NCO and OH groups proceeds relatively slowly in an acidic medium, and therefore also in the presence of carboxyl groups, as is described in the publication of Becker and Braun mentioned in the introduction. The first reaction stage therefore results only in relatively low-molecular prepolymers, which can then be reacted in the second stage within a relatively short time to form high-molecular products by means of the rapidly proceeding reaction of NCO groups with amino groups.

The polyurea urethanes have in general a mean molecular weight $M_w$ of more than 1000, preferably of 10,000 to 200,000. The acid number of the polymers is in the range from 1 to 350, preferably from 5 to 200, and in particular from 20 to 150. The low acid numbers are still adequate for a purely aqueous alkaline development provided the polymers still contain, as mentioned above, substantial proportions of hydrophilic polyether sequences.

In addition to the polymers described, the mixtures according to the invention also contain olefinically unsaturated polymerizable compounds, polymerization initiators which can be activated by actinic radiation, in particular by ultraviolet or visible light, and optionally, further standard constituents of photopolymerizable mixtures.

In addition to the polyurethanes described above, they may contain other standard polymers in smaller quantities of up to about 50%, based on the polyurethanes, as binders. Polyamides, epoxy resins, homopolymers and copolymers of acrylic and methacrylic acid esters, polyvinyl acetals, polyvinyl acetates and polystyrenes, for example, are suitable.

Possible polymerizable monomers are compounds containing at least one unsaturated double bond. As examples of monofunctional compounds, mention may be made of longchain substituted and unsubstituted alkyl esters or alkoxyalkyl esters of methacrylic acid and acrylic acid, such as are described, for example, in EP-A-128,014. Furthermore, monomers containing urethane groups may advantageously be used. Examples thereof are to be found in DE-A-3,540,480.

The mixtures according to the invention preferably contain at least some polymerizable compounds containing at least two terminal olefinic double bonds. In general esters of acrylic acid or methacrylic acid with polyhydric, preferably primary, alcohols are used as polymerizable compounds of this type. Examples of suitable polyhydric alcohols are ethylene glycol, propylene glycol, 1,4-butanediol, 1,3-butanediol, diethylene glycol, triethylene glycol, polyethylene glycols or polypropylene glycols having molecular weights of about 200 to 1000, neopentyl glycol, trimethylolethane and trimethylolpropane, pentaerythritol and ethoxylated bisphenol A derivatives.

A multiplicity of substances can be used in the mixture according to the invention as polymerization initiators which can be activated by radiation, in particular actinic light. Examples are benzoin and its derivatives, polynuclear quinones, trichloromethyl-s-triazines, carbonylmethylene heterocyclics containing trihalomethyl groups, for example 2-(p-trichloromethylbenzoylmethylene)-3-ethylbenzthiazoline, acridine derivatives, for example 9-phenylacridine, 9-p-methoxyphenylacridine, 9-acetylaminoacridine, benz(a)acridine; phenazine derivatives, for example 9,10-dimethylbenz(a)phenazine, 10-methoxybenz(a)-phenazine, quinoxaline derivatives, for example 6,4',4"-trimethoxy-2,3-diphenylquinoxaline, 4',4"-dimethoxy-2,3-diphenyl-5-azaquinoxaline or quinazoline derivatives. The initiators are generally used in an amount of about 0.01 to 10, preferably of 0.1 to 8% by weight, based on the nonvolatile constituents of the mixture.

The mixture according to the invention in general contains about 30 to 90, preferably 40 to 85, % by weight of binder and about 5 to 70, preferably 10 to 60, % by weight of polymerizable compounds, based in each case on the total amount of nonvolatile constituents.

The mixture may contain polymerization inhibitors, hydrogen donors, photosensitivity regulators, dyestuffs, pigments, plasticizers and thermally activable crosslinking agents as standard additional constituents.

To achieve a color change in the exposed regions of the coating, compounds which react with acidic photolysis products, for example of photoinitiators containing trichloromethyl groups, and produce a color change in doing so are added to the mixture. Examples of such contrast agents are simple primary and secondary aromatic amines, and also leuco dyestuffs, for example diphenylamine, dibenzylamine, triphenylamine, diethylaniline, diphenyl-p-phenylenediamine, p-toluidine, 4,4'-diaminodiphenyl, o-chloroaniline, o-bromoaniline, 4-chloro-o-phenylenediamine, o-bromo-N,N-dimethylaniline, 1,2,3-triphenylguanidine, naphthylamines, diaminodiphenylmethane, aniline, 2,5-dichloroaniline, N-methyldiphenylamine, 4,4'-bis(dimethylamino)diphenylmethane, N,N-dimethyl-p-phenylenediamine, 1,2-dianilinoethylene, 4,4',4"-triamino-o-methyltriphenylmethane, 4,4',4"-triaminotriphenylcarbinol and the leuco base of crystal violet.

The mixtures according to the invention can be processed to form photosensitive materials in a known manner in accordance with their application. Propylene glycol monomethyl ether, ethylene glycol monomethyl ether, ethylene glycol monoacetate, dioxane, tetrahydrofuran, butyl acetate, butanone etc., for example, may be used as solvent or solvent mixture from which the coating takes place. For the purpose of further processing, the solutions obtained are filtered in order to remove any undissolved constituents, and applied to a suitable base material in a manner known per se, e.g., by doctor-blading or spinning, and dried. Suitable base materials are, for example, aluminum which has been mechanically or electrochemically roughened and possibly anodized and post-treated, aluminum-clad films or films hydrophilized in another manner, films vapor-coated with copper or multimetal foils. The form of application depends to a considerable degree on the desired layer thickness of the photosensitive layer.

After drying, this layer is preferably coated with a top layer which acts as an oxygen barrier. This may preferably be composed of a material which dissolves in the developer liquid or can be removed at least at the non-cured points during the development. Suitable materials for this purpose are, for example, waxes, polyvinyl alcohol, polyphosphates, sugar etc.

After adequate drying, the materials can be converted into their particular application form in a manner known per se by imagewise exposure by means of a negative film master. The plates exposed imagewise are developed preferably with a purely aqueous developer. The developer solution may, moreover, contain surfactants and alkaline buffer substances such as sodium silicate or sodium phosphates.

The mixtures according to the invention make it possible to produce lithographic printing forms which are outstanding for relatively high run performance, good copying behavior and high storage stability. They can be developed easily and without scumming using developer solutions which are free of organic solvents. Compared with comparable known printing plates on a polyurethane basis, they exhibit a higher print run, less stickiness, a markedly higher photosensitivity and a steeper gradation.

Examples explaining preferred embodiments of the mixture and material according to the invention are presented below. Unless otherwise specified, quantitative ratios and percentages therein are to be understood in weight units. The amounts in the application examples are stated in parts by weight (pbw). First of all, preparation examples are presented for the polyurethanes; Preparation Example 1 describes the preparation of a polyurethane according to JP-A 61/20939. All the reactions of the synthesis examples were carried out under nitrogen.

SYNTHESIS EXAMPLE 1 (COMPARISON EXAMPLE)

17.8 g of polypropylene glycol (M=480), 0.24 g of toluenesulfonyl isocyanate and 150 g of anhydrous tetrahydrofuran were stirred for 15 minutes in a three-necked flask with a capacity of 250 ml. 13.0 g of tolylene 2,4-diisocyanate and 0.17 g of dibutyltin dilaurate were then added, the mixture was refluxed for one hour, and the solution obtained was added dropwise to a mixture of 7.6 g of the monoamide formed from 1 mol of succinic anhydride and 1 mol of diethanolamine in 184 g of tetrahydrofuran and heated for 22 hours under reflux until isocyanate was no longer present in the solution. A weight average of the molecular weight ($M_w$) of 8500 was determined with the aid of gel permeation chromatography (polystyrene standard).

The acid number was 54 mg KOH/g of substance.

SYNTHESIS EXAMPLE 2

16.1 g of polypropylene glycol (M=480), 65.7 g of anhydrous tetrahydrofuran and 0.22 g of toluenesulfonyl isocyanate were stirred for 15 minutes in a three-necked flask with a capacity of 250 ml. 13 g of tolylene-2,4-diisocyanate and 0.17 g of dibutyltin dilaurate were then added and the mixture was heated under reflux for two hours. 6.9 g of the addition product formed from 1 mol of succinic anhydride and 1 mol of diethanolamine were then added and refluxing was continued for a further two hours. The solution was then diluted with 42.2 g of tetrahydrofuran and 1.95 g of polyoxypropylenediamine (M=420) in 42.2 g of tetrahydrofuran were added dropwise.

The acid number of the polymer was 48.

Gel permeation chromatography yielded a molecular weight ($M_w$) of 27,000 (polystyrene standard).

SYNTHESIS EXAMPLE 3

76 g of polypropylene glycol (M=480), 21.3 g of 2,2-bis(hydroxymethyl)propionic acid and 260 g of tetrahydrofuran (anhydrous) were weighed into a three-necked flask with a capacity of 1000 ml and 1.25 g of toluenesulfonyl isocyanate were added. The suspension was stirred for 15 minutes, then 75 g of naphthalene-1,5-diisocyanate and 1 g of dibutyltin dilaurate were added and the mixture was heated for 8 hours under reflux. After cooling to room temperature, the isocyanate content was determined as a check. For this purpose, an excess amount of dibutylamine was added to a sample of the prepolymer and after being allowed to stand for 15 minutes, the unreacted dibutylamine was backtitrated with hydrochloric acid. The prepolymer was diluted with 250 g of tetrahydrofuran (anhydrous) and a solution of 15.3 g of polyoxypropylenediamine (M=420) and 247 g of tetrahydrofuran was added dropwise.

The 30% strength polymer solution obtained can be used directly for coating. For analytical purposes, 100 g of the polymer solution were dissolved in 1 liter of a 1% strength aqueous ammonia solution and the polymer was precipitated therefrom by acidification with 10% strength hydrochloric acid. The polymer was filtered using a glass frit, washed with water and dried in vacuo. 25 g (83%) of the polymer having the acid number 51 were isolated. The molecular weight $M_w$ was determined to be 30,000 with the aid of gel permeation chromatography (polystyrene standard).

SYNTHESIS EXAMPLES 4 TO 13

The polymers in the Examples 4 to 13 (cf. Table 1) were prepared in the same manner as in Example 3. The titrated acid numbers agreed with the theoretically calculated ones. The molecular weights $M_w$ of the precipitated polymers were in the range from 20,000 to 40,000 (polystyrene standard). Depending on the isocyanate used and the amount of the dihydroxycarboxylic acid, the reaction times were in the range from 1.5 to 35 hours.

ride with 2-methoxy-5-acetylamino-N,N-diethylaniline, and 0.036 pbw of dyestuff C.I. Disperse Red 179 in 75.0 pbw of propylene glycol monomethyl ether was deposited on a 0.3 mm thick aluminum foil which had been electrochemically roughened in an aqueous solution of nitric acid, anodized in a sulfuric acid bath and then hydrophilized with a 0.1% strength aqueous solution of polyvinylphosphonic acid, and the foil was then dried for 2 minutes in a circulating-air oven (dry layer weight=2.5 g/m$^2$). The plate was then coated with a 15% strength aqueous solution of polyvinyl alcohol (12% residual acetyl groups, K-value 4). The printing plate obtained was exposed for 10 seconds by means of a 5 kW metal halaide lamp at a distance of 110 cm under a 13-step exposure wedge with density increments of 0.15. The plate was then developed with a solution composed of 8.5 pbw of Na$_2$SiO$_3$ 9 H$_2$O, 0.8 pbw of NaOH, and 1.5 pbw of Na$_2$B$_4$O$_7$ 10 H$_2$O in 89.2 pbw of water.

Step 4 of the continuous-tone step wedge was covered.

APPLICATION EXAMPLE 2 (COMPARISON EXAMPLE)

A lithographic printing plate was prepared in accordance with the data in Application Example 1, but instead of the polymer solution from Synthesis Example 2, the solution from Synthesis Example 1 was used. The same developer as in Application Example 1 was used.

In order to obtain step 4 in the continuous-tone step

TABLE 1

| Synthesis Example | 3 | 4 | 5 | 6 | 7 | 8 | 9 | 10 | 11 | 12 | 13 |
|---|---|---|---|---|---|---|---|---|---|---|---|
| Tolylene-2,4-diisocyanate | — | 35,37 | 36,56 | — | — | — | — | — | 42,4 | — | — |
| Diphenylmethane-4,4'-diisocyanate | — | — | — | — | 33,31 | — | — | — | — | — | 32,78 |
| Hexamethylene diisocyanate | — | — | — | — | — | — | 41,49 | — | — | — | — |
| Isophorone diisocyanate | — | — | — | — | — | 41,74 | — | — | — | — | — |
| Dicyclohexylmethane 4,4'-diisocyanate | — | — | — | 52,15 | — | — | — | 53,01 | — | 44,98 | — |
| Naphthalene-1,5-diisocyanate | 39,89 | — | — | — | — | — | — | — | — | — | — |
| 2,2-Bis(hydroxymethyl)propionic acid | 11,35 | 12,34 | 12,8 | 18,1 | 7,99 | 10,94 | 22,96 | 18,45 | 22,56 | 10,23 | — |
| Polypropylene glycol (M = 480) | 40,63 | 44,16 | 34,37 | 21,59 | 28,59 | 39,18 | 27,4 | 16,49 | 26,9 | 36,64 | 28,09 |
| 2,2-Bis(4-hydroxyethoxyphenyl)propane | — | — | 8,19 | — | — | — | — | 3,92 | — | — | — |
| 2,4-Dihydroxybenzoic acid | — | — | — | — | — | — | — | — | — | — | 9,01 |
| Polyoxypropylenediamine (M = 420) | 8,14 | 8,13 | 8,08 | 8,16 | — | 8,14 | 8,15 | 8,14 | 8,14 | 8,14 | — |
| Polyoxypropylenediamine (M = 2000) | — | — | — | — | 30,11 | — | — | — | — | — | 30,12 |
| Acid number | 46 | 51 | 53 | 75 | 32 | 45 | 95 | 76 | 93 | 42 | 32 |
| Reaction time (hours) | 8 | 7 | 9,5 | 20 | 1,5 | 35 | 30 | 15 | 11 | 15 | 12 |

APPLICATION EXAMPLE 1

A coating solution composed of 18.1 pbw of the 20% strength polymer solution from Synthesis Example 2, 3.6 pbw of trimethylolethane triacrylate, 0.02 pbw of tris(4-dimethylaminophenyl)methane, 0.123 pbw of 2-(4-styrylphenyl)-4,6-bistrichloromethyl-s-triazine, 0.073 pbw of a blue azo dyestuff prepared by coupling 2,4-dinitro-6-chlorobenzenediazonium chlowedge in covered form, the plate had to be exposed for 40 seconds. The print run of this plate was only half as great as the run of the lithographic printing plate from Application Example 1.

APPLICATION EXAMPLES 3 TO 11

The lithographic plates of Examples 3 to 11 were prepared analogously to the Application Example 1, and correspondingly exposed and developed. Composition, exposure time and developability are listed in Table 2.

TABLE 2

| The numerical data correspond to parts by weight unless otherwise specified | | | | | | | | | |
|---|---|---|---|---|---|---|---|---|---|
| Application example | 3 | 4 | 5 | 6 | 7 | 8 | 9 | 10 | 11 |
| Binder* | 6 | 3 | 2 | 6 | 3 | 5 | 5 | 6 | 3 |
| Trimethylolethane triacrylate | — | 1.8 | 1.8 | 1.8 | — | — | 1.8 | 1.8 | — |
| Pentaerythritol triacrylate | 1.8 | — | — | — | 1.8 | 1.8 | — | — | 1.8 |
| Diurethane** | 1.8 | 1.8 | 1.8 | 1.8 | 1.8 | 1.8 | 1.8 | 1.8 | 1.8 |
| 2-(4-Styrylphenyl)-4,6-bistrichloro- | 0.12 | 0.12 | 0.12 | 0.12 | 0.12 | 0.12 | 0.12 | 0.12 | 0.12 |

TABLE 2-continued

The numerical data correspond to parts by weight unless otherwise specified

| Application example | 3 | 4 | 5 | 6 | 7 | 8 | 9 | 10 | 11 |
|---|---|---|---|---|---|---|---|---|---|
| methyl-s-triazine | | | | | | | | | |
| Blue azo dyestuff according to Application Example 1 | 0.073 | 0.073 | 0.073 | 0.073 | 0.073 | 0.073 | 0.073 | 0.073 | 0.073 |
| C.I. Disperse Red 179 | 0.036 | 0.036 | 0.036 | 0.036 | 0.036 | 0.036 | 0.036 | 0.036 | 0.036 |
| 4-Diethylamino-4'-methoxydibenzal acetone | — | 0.05 | — | 0.10 | 0.20 | — | 0.1 | 0.05 | 0.05 |
| Tris-(4-dimethylaminophenyl)methane | 0.02 | 0.02 | 0.02 | 0.02 | 0.02 | 0.02 | 0.02 | 0.02 | 0.02 |
| 2-Methoxypropanol | 100.0 | 100.0 | 100.0 | 100.0 | 100.0 | 100.0 | 100.0 | 100.0 | 100.0 |
| Exposure time (s) | 20 | 15 | 10 | 20 | 20 | 7 | 20 | 15 | 10 |
| Developability | moderate | good | good | good | good | good | good | good | good |
| Taber abrasion*** | 0.12 | 0.10 | 0.22 | 0.05 | 0.06 | 0.11 | 0.14 | 0.09 | 0.11 |

*12 g of 30% strength solution in tetrahydrofuran in all cases. The numbers denote the numbers of the preparation example for the polymer.
**formed from 2 mol of hydroxyethyl methacrylate and 1 mol of 2,4,4-trimethylhexamethylene diisocyanate.
***Weight loss in g/m² determined on a sample mounted on a rotating turntable and pressed against two emery rollers, after 20 revolutions.
Method analogous to ASTM D 1300.

What is claimed is:

1. A radiation-polymerizable mixture which comprises:
   a) a saturated polyurea-polyurethane having an acid number from about 20 to 150 and comprising
      i) units which are produced from a diol comprising carboxyl groups,
      ii) units which are produced from a diamine containing primary or secondary amino groups that are linked by a polyether group and
      iii) units which are produced from a diisocyanate, as binder,
   b) a radical-polymerizable compound containing at least one terminal olefinic double bond and having a boiling point above 100° C. at normal pressure, and
   c) a compound or combination of compounds capable of initiating the polymerization of compound (b) on exposure to actinic radiation.

2. A mixture as claimed in claim 1, wherein said urea groups are produced from diamine units in the main chain of said polyurethane.

3. A mixture as claimed in claim 1, wherein the ratio of urea groups to urethane groups in said polyurethane is in the range from about 1:99 to 95:5 mole %.

4. A mixture as claimed in claim 1, wherein said diol comprising carboxyl groups is of the formula

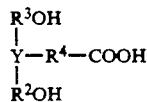

in which
   Y is a nitrogen atom or one of the groups Ar and C—R¹,
   Ar is a substituted or unsubstituted trivalent aromatic group,
   R¹ is a hydrogen atom, a substituted or unsubstituted alkyl, aralkyl, aryl, alkoxy or aryloxy group, and
   R², R³ and R⁴ are identical or different and are each a single bond, a substituted or unsubstituted alkylene, alkylenecarbonyl, arylene or mixed aliphatic-aromatic divalent hydrocarbon group.

5. A mixture as claimed in claim 4, wherein R¹ is a hydrogen atom, an alkyl group containing 1 to 8 carbon atoms or an aryl group containing 6 to 15 carbon atoms.

6. A mixture as claimed in claim 4, wherein R², R³ and R⁴ are each a single bond or an alkylene or alkylenecarbonyl group containing 1 to 8 carbon atoms.

7. A mixture as claimed in claim 4, wherein Ar contains 6 to 12 carbon atoms.

8. A mixture as claimed in claim 1, wherein said polyurethane further comprises units of a diol lacking carboxyl groups.

9. A mixture as claimed in claim 8, wherein said diol lacking carboxyl groups is a polyether diol.

10. A mixture as claimed in claim 1, wherein said polyurethane has an acid number in the range from about 1 to 350.

11. A mixture as claimed in claim 10, wherein said polyurethane has an acid number in the range from 5 to 200.

12. A mixture as claimed in claim 1, wherein said polyurethane has a mean molecular weight $M_w$ of more than 1000.

13. A mixture as claimed in claim 12, wherein said polyurethane has a mean molecular weight $M_w$ of about 10,000 to 200,000.

14. A mixture as claimed in claim 1, wherein said polyurethane is produced by reacting a diol comprising carboxyl groups with an excess of a diisocyanate and reacting the reaction product with a diamine.

15. A mixture as claimed in claim 1, wherein said polymerizable compound is an ester of acrylic acid or methacrylic acid with an aliphatic alcohol.

16. A mixture as claimed in claim 1, wherein said polymerizable compound contains at least two polymerizable groups.

17. A mixture as claimed in claim 1, comprising about 30 to 90 wt % of said binder (a), about 5 to 70 wt % of said polymerizable compound (b) and about 0.01 to 10 wt % of said initiator compound or compounds (c), based on the total amount of nonvolatile constituents of the mixture.

18. A Radiation-polymerizable copying material comprising a layer support and a radiation-polymerizable layer, wherein the layer comprises a mixture as claimed in claim 1.

19. A copying material as claimed in claim 18, further comprising a transparent top layer with low oxygen permeability disposed on said radiation-polymerizable layer.

* * * * *